US010393816B2

(12) United States Patent
Inamoto et al.

(10) Patent No.: US 10,393,816 B2
(45) Date of Patent: Aug. 27, 2019

(54) VOLTAGE-DETECTING DEVICE APPLIED TO BATTERY PACK HAVING SERIALLY CONNECTED BODY

(71) Applicant: DENSO CORPORATION, Kariya, Aichi-pref. (JP)

(72) Inventors: Takashi Inamoto, Kariya (JP); Tsuneo Maebara, Kariya (JP); Ryotaro Miura, Kariya (JP)

(73) Assignee: DENSO CORPORATION, Kariya (JP)

( * ) Notice: Subject to any disclaimer, the term of this patent is extended or adjusted under 35 U.S.C. 154(b) by 43 days.

(21) Appl. No.: 15/706,108

(22) Filed: Sep. 15, 2017

(65) Prior Publication Data

US 2018/0088178 A1 Mar. 29, 2018

(30) Foreign Application Priority Data

Sep. 23, 2016 (JP) .................. 2016-185619

(51) Int. Cl.
*G01R 31/36* (2019.01)
*G01R 31/3835* (2019.01)
*G01R 31/396* (2019.01)

(52) U.S. Cl.
CPC ........ *G01R 31/3835* (2019.01); *G01R 31/396* (2019.01)

(58) Field of Classification Search
None
See application file for complete search history.

(56) References Cited

U.S. PATENT DOCUMENTS

2011/0196632 A1*  8/2011  Shimizu ............. G01R 31/3624
                                                                 702/63
2014/0147713 A1   5/2014  Mizobe et al.

\* cited by examiner

*Primary Examiner* — Clayton E. LaBalle
*Assistant Examiner* — Jas A Sanghera
(74) *Attorney, Agent, or Firm* — Oliff PLC

(57) ABSTRACT

A voltage-detecting device applied to a battery pack includes a serially connected body of plural battery cells.
Serially connected bodies of at least two of the battery cells of the battery pack form detection blocks; each of the respective battery cells of a detection block, or a serially connected body of a number of battery cells in a detection block that is less than the number of the battery cells of the detection block is taken to be a battery for which voltage is to be detected. Monitoring units includes a main voltage-detecting unit for detecting terminal voltage of each of the batteries; a positive-electrode-side input unit electrically connected to the positive-electrode side of a detection block; a negative-electrode-side input unit electrically connected to the negative-electrode side thereof; and sub voltage-detecting units for detecting terminal voltage of the detection blocks as the state of the battery pack.

7 Claims, 6 Drawing Sheets

VOLTAGE-DETECTING DEVICE APPLIED TO BATTERY PACK HAVING SERIALLY CONNECTED BODY

CROSS-REFERENCE TO RELATED APPLICATION

This application is based on and claims the benefit of priority from earlier Japanese Patent Application No. 2016-185619 filed Sep. 23, 2016, the description of which is incorporated herein by reference.

BACKGROUND OF THE INVENTION

Technical Field

The present disclosure relates to a voltage-detecting device applied to a battery pack having a serially connected body of plural battery cells.

A voltage-detecting device for detecting terminal voltage of a battery cell of a conventional battery pack is known. For example, in JP-A-2014-107979, a battery pack that is the object of voltage detection by a voltage-detecting device includes plural detection blocks that are serially connected bodies having at least two battery cells.

The voltage-detecting device includes a monitoring unit for detecting the state of the battery pack, and a control unit that is separately provided from the monitoring unit and to which the detection results of the monitoring unit are inputted. The monitoring unit includes a main-voltage-detecting unit for detecting the terminal voltages of each of the battery cells in a detection block, for example. The control unit performs control of charging and discharging of the battery cells based on the inputted voltage-detection results.

The control unit further includes a sub-voltage-detecting unit for detecting terminal voltages of the detection blocks. From the aspect of functional safety of the voltage-detecting device, the sub-voltage-detecting unit is provided as a redundant configuration for the voltage detecting unit.

The control unit determines whether or not there is abnormality in a battery pack based on the voltage-detection results of the sub-voltage-detecting unit.

The voltage-detecting device described above includes electrical paths that are connected to both the positive-electrode side and negative-electrode side of the detection blocks, and switches that are provided in each electrical path. The control unit selects a detection block from among the plural detection blocks for which the terminal voltage is to be detected. The control unit instructs the closing operation of the switches that are provided in the pair of electrical paths that are connected to the selected detection block. Then, in a state in which the switches are closed, the sub-voltage-detecting unit detects that terminal voltage of the detection block by the pair of electrical paths.

A pair of electrical paths for detecting voltage is provided in each detection block. These electrical paths are connected to the sub-voltage-detecting unit via a voltage-input unit that is provided in the control unit. Here, considering that the main body that outputs instructions for operating switches is the control unit, configuration in which the switches are provided in the control unit is conceivable. In that case, the number of voltage-input units that are provided in the control unit must be the same as the number electrical paths above. However, in this configuration, when the number of detection blocks changes due to changing the specifications of the battery pack, the number of the voltage-input units also changes. As a result, it is necessary to change the shape of the control unit. Doing so is not preferable from the aspect of commonality of components.

SUMMARY

Hence, it is desired to provide a voltage-detecting device that can be applied to a battery pack, and that can make parts common.

The first aspect of the present disclosure is a voltage-detecting device that is applied to a battery pack that includes a serially connected body of plural battery cells, and includes: monitoring units for detecting the state of the battery pack; and a control unit that is separately provided from the monitoring units, and to which the detection results of the monitoring units are inputted. In the first aspect, serially connected bodies of at least two of the battery cells of the battery cells of the battery pack form detection blocks; and each of the respective battery cells of a detection block, or a serially connected body of a number of battery cells in a detection block that is less than the number of the battery cells of the detection block is taken to be a battery for which voltage is to be detected. The monitoring units have: a main voltage-detecting unit for detecting terminal voltage of each of the batteries for which voltage is to be detected as the state of the battery pack; a positive-electrode-side input unit that is electrically connected to the positive-electrode side of a detection block; a negative-electrode-side input unit that is electrically connected to the negative-electrode side of a detection block; and sub voltage-detecting units for detecting terminal voltage of the detection blocks via the positive-electrode-side input units and the negative-electrode-side input units as the state of the battery pack.

In the first embodiment, the monitoring units have a main voltage-detecting unit, a positive-electrode-side input unit that is electrically connected to the positive-electrode side of a detection block, and a negative-electrode-side input unit that is electrically connected to the negative-electrode side of a detection block. Moreover, the monitoring units further have sub voltage-detecting units for detecting terminal voltage of the detection blocks via the positive-electrode-side input units and the negative-electrode-side input units.

The sub voltage-detecting units include monitoring units, and in configuration in which plural detection blocks are provided, it is not necessary to provide a number of voltage-input units for electrically connecting the detection blocks and the control unit in the control unit to correspond to each of the detection blocks. Therefore, even though the number of detection blocks may change due to changes in specifications of the battery pack, it is possible to make the control unit of the voltage-detecting device common.

In a second aspect of the present disclosure, the main voltage-detecting unit includes a monitoring IC that is an integrated circuit having a rectangular parallelepiped shape that is flat in the thickness direction; at least part of the sub voltage-detecting unit includes a redundant IC that is a separate integrated circuit from the monitoring IC and has a rectangular parallelepiped shape that is flat in the thickness direction; on the monitoring IC, one of the two outer surfaces of which the thickness direction is the normal direction is taken to be the rear monitoring surface and the other surface is taken to be the front monitoring surface; of the redundant IC, one of the two outer surfaces of which the thickness direction is the normal direction is taken to be rear redundant surface and the other surface is taken to be the front redundant surface; the surface area of the front monitoring surface has a surface area that is greater than the surface area of the rear redundant surface; and the rear redundant surface is mechanically connected to the front monitoring surface in a state in which, when the monitoring IC is viewed from the front monitoring surface, the contour of the redundant IC does not protrude from the contour of the monitoring IC.

In the second aspect of the present disclosure, the main voltage-detecting unit includes a monitoring IC that is an integrated circuit having a rectangular parallelepiped shape that is flat in the thickness direction. Moreover, at least part of the sub voltage-detecting unit includes a redundant IC that is a separate integrated circuit from the monitoring IC and has a rectangular parallelepiped shape that is flat in the thickness direction. The terms "monitoring" and "redundant" that are applied to each IC are simply for identifying the IC in which the main voltage-detecting unit is included, and the IC in which at least part of the sub voltage-detecting unit is included.

The object for voltage detection by a sub voltage-detecting unit is a detection block, and the object for voltage detection by a main voltage-detecting unit is a number of battery cells that is less than the number of battery cells of a detection block. Therefore, the precision for detecting voltage that is required by a main voltage-detecting unit is higher than the precision for detecting voltage that is required by a sub voltage-detecting unit.

Here, by stress acting on a monitoring IC that includes a main voltage-detecting unit, the monitoring IC may become distorted. A cause for stress acting may be thermal stress, for example. As thermal stress, there is thermal stress during reflow process when attaching the monitoring IC to the monitoring unit, or there is thermal stress due to a change in temperature of the surrounding environment of the monitoring IC. When the monitoring IC becomes distorted, there is a possibility that the precision for detecting voltage by the main voltage-detecting unit of the monitoring IC will decrease.

Therefore, in the second aspect, the surface area of the front monitoring surface of the monitoring IC is made to be equal to or greater than the surface area of the rear redundant surface of the redundant IC. The rear redundant surface is mechanically connected to the front monitoring surface in a state in which, when the monitoring IC is viewed from the front monitoring surface, the contour of the redundant IC does not protrude from the contour of the monitoring IC. Therefore, even when stress acts on the monitoring IC, it is possible for the redundant IC to suppress distortion of the monitoring IC. As a result, it is possible to prevent a decrease in the precision for detecting voltage by the main voltage-detecting unit.

In addition, with the second aspect, a redundant IC is provided on the front monitoring surface of a monitoring IC, so it is possible to reduce the required surface area for mounting each of the detecting units when a monitoring unit includes a main voltage-detecting unit and sub voltage-detecting unit. As a result, it is possible to make the monitoring unit more compact.

Instead of the second aspect, it is also possible to employ configuration such as in a fourth aspect, for example, in which a monitoring IC and a redundant IC are arranged side by side in the plan view of the monitoring IC and the redundant IC.

A third aspect includes a lead frame on which the monitoring IC is placed from the rear monitoring surface, and that has plural leads around the perimeter thereof. In the third aspect, the surface area of the front monitoring surface is larger than the surface area of the rear redundant surface; the monitoring IC has plural electrode pads that are formed along one edge of the front monitoring surface in an area of the front monitoring surface that does not overlap the redundant IC when the monitoring IC is viewed from the front monitoring surface; the redundant IC has plural electrode pads that are formed on the front redundant surface along one edge of the front redundant surface; the rear redundant surface is mechanically connected to the front monitoring surface in a state in which the electrode pads of the redundant IC and the electrode pads of the monitoring IC face in the same direction or nearly the same direction; and one of the electrode pads of the redundant IC and one of the electrode pads of the monitoring IC are electrically connected using a bonding wire to a lead of plural leads that is used in common by the monitoring IC and the redundant IC.

There is configuration in which the connecting point between one electrode pad of the redundant IC and one electrode pad of the monitoring IC is a lead of plural leads that is used in common by the monitoring IC and the redundant IC. In this configuration, when the distance between the electrode pad of the front redundant surface and the lead that is used in common when the monitoring IC is viewed from the front monitoring surface is long, there is a possibility that the bonding wire that connects the lead that is used in common and the electrode pad of the front redundant surface may be cut. In order to avoid this problem, configuration may be employed in which an electrode pad is formed as a relay on the front monitoring surface of the monitoring IC, and together with connecting the electrode pad on the front redundant surface and the relay electrode pad using bonding wire, the relay electrode pad and the lead that is used in common are connected using bonding wire. However, in this configuration it is necessary to form an extra electrode pad on the monitoring IC as a relay electrode pad. Moreover, in this configuration, the number of operations for making connections using bonding wire increases.

Therefore, in the third aspect, the surface area of the front monitoring surface is larger than the surface area of the rear redundant surface, and plural electrode pads are formed along one edge of the front monitoring surface in an area of the front monitoring surface that does not overlap the redundant IC when the monitoring IC is viewed from the front monitoring surface. Moreover, plural electrode pads are formed on the front redundant surface along one edge of the front redundant surface. The rear redundant surface is mechanically connected to the front monitoring surface in a state in which the electrode pads of the redundant IC and the electrode pads of the monitoring IC face in the same direction or in nearly the same direction.

With this third aspect, when the monitoring IC is viewed from the front monitoring surface, the distance between the electrode pad of the front redundant surface and the lead that is used in common can be shortened. Therefore, it is possible to directly connect one electrode pad of the redundant IC and one electrode pad of the monitoring IC to the lead that is used in common using bonding wire. As a result, it is not necessary to form a relay electrode pad on the monitoring IC, so it is possible to reduce the number of electrode pads that are formed on the monitoring IC. Moreover, it is possible to prevent an increase in the number of operations for connecting with bonding wire.

In a fifth aspect, the number of detection blocks is plural; monitoring units are separately provided so as to correspond to each of the detection blocks; the sub voltage-detecting unit has: voltage-dividing resistors that are resistors for dividing the terminal voltage of the detection block; a reference-power source that is a power source for outputting a reference voltage for detecting the charged state of the detection block; and a comparator that includes an inverting-input terminal and a non-inverting-input terminal, and to which voltage divided by the voltage-dividing resistors is inputted to one of the terminals, and the reference voltage is inputted to the other terminal. The fifth aspect includes a direct-current power source; and a resistor of which a first end side is connected to the direct-current power source. In this fifth aspect, the monitoring unit has: a signal-output unit; and a communication switch that is closed or opened according to the logic of the output voltage of the output terminal of the comparator, and is a switch that electrically connects the signal-output unit and ground; the second end side of the resistor is electrically connected to the signal-output unit of each monitoring unit; and the control unit has a signal-input unit that is electrically connected to the second-end side of the resistor.

In the fifth aspect, a monitoring unit has a signal-output unit and a communication switch. Moreover, the fifth aspect includes a direct-current power source, and a resistor, a first end side of which is connected to the direct-current power source. The signal-input unit of the control unit is electrically connected to a second end side of the resistor. With this configuration, even when the number of detection blocks changes due to changes in specifications of the battery pack, it is not necessary to change the number of signal-input units of the control unit. Therefore, even though the specifications of the battery pack may change, it is possible to make the control unit of the voltage-detecting device common.

In the fifth aspect, the sub voltage-detecting unit includes voltage-dividing resistors, a reference power source, and a comparator. With this configuration, voltage divided by the voltage-dividing resistors inverts the logic value of the output voltage of the output terminal of the comparator by passing through the reference voltage for detecting the charged state of the detection block.

When determining the logic value of the output voltage of the output terminal of the comparator, the operated state of the communication switch that electrically connects the signal-output unit and ground is switched from one state to the other state of the closed state and open state. With this configuration, when the logic of the output voltage of the output terminal of at least one of the comparators of the monitoring units is inverted, the logic of the input signal of the signal-input unit that is electrically connected to the second end side of the resistor is inverted. Therefore, the control unit is able to determine the charged state of detection blocks based on the input signal of the signal-input unit.

Here, the voltage-detecting device can perform a diagnostic process of the reference power source, or a communication system from the comparator to the signal-input unit via the communication switch and the signal-output unit. More specifically, as in a sixth aspect, the voltage-detecting device includes: a voltage-generating unit that generates and outputs a diagnostic voltage; a first switch that, when in a closed state, electrically connects the detection block and the voltage-dividing resistors, and when in an open state, electrically disconnects the detection block and the voltage-dividing resistors; and a second switch that, when in a closed state, electrically connects the divided-voltage input terminal that is the terminal of the non-inverting-input terminal and the inverting-input terminal of the comparator to which voltage divided by the voltage-dividing resistors is inputted and the voltage-generating unit, and when in the open state, electrically disconnects the divided-voltage input terminal and the voltage-generating unit. In the sixth aspect, configuration can be employed in which the control unit performs a process for setting the first switch to the open state and the second switch to the closed state, and in this state operates the voltage-generating unit in order to change the diagnostic voltage so as to pass through the reference voltage; and performs a process for determining that an abnormality has not occurred in the reference power source when it is determined that the logic of the input signal of the signal-input unit is inverted when the diagnostic voltage is changed, and for determining that an abnormality has occurred in the reference power source when it is determined that the logic of the input signal of the signal-input unit is not inverted when the diagnostic voltage is changed.

As configuration for performing a diagnostic process, for example, as in a seventh aspect, a configuration can be employed in which the control unit performs a process for setting the first switch to the open state and the second switch to the closed state, and in this state operates the voltage-generating unit in order to make the diagnostic voltage less than the reference voltage, or make the reference voltage higher than the reference voltage; and performs a process for diagnosing whether or not there is an abnormality in a communication system based on the logic of the input signal of the signal-input unit when the diagnostic voltage is made to be less than the reference voltage, or when the reference voltage is made to be higher than the reference voltage.

Incidentally, as in an eighth aspect for example, configuration may be employed in which the voltage-generating unit is provided in the main voltage-detecting unit. With this configuration, it is possible use the voltage-generating unit that is provided in the main voltage-detecting unit for abnormality diagnosis of the reference power source or communication system, and thus it is possible to prevent an increase in circuits for diagnosis.

DETAILED DESCRIPTION OF PREFERRED EMBODIMENTS (First Embodiment)

In the following, a first embodiment of a voltage-detecting device according to the present disclosure will be explained with reference to the drawings. The voltage-detecting device according to the present disclosure is applied to a power-source system that is mounted, for example, in a hybrid automobile or an electric automobile.

Figure 1:
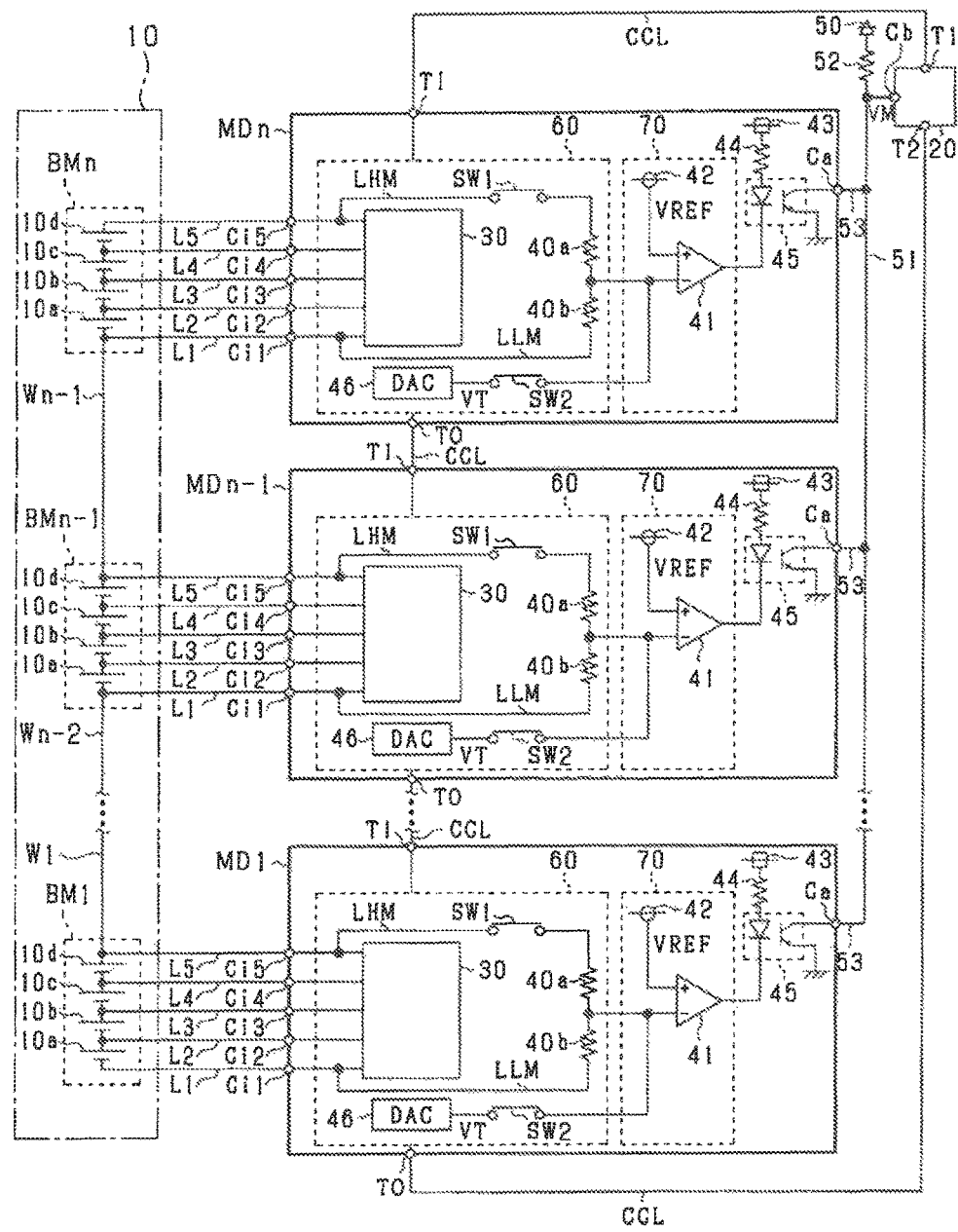
FIG. 1 is an overall configuration diagram of the power-source system according to a first embodiment.

As illustrated in FIG. 1, a power-source system includes a battery pack 10. The battery pack 10 is the electric power supply source for the in-vehicle electrical load that includes the running motor of the vehicle. The battery pack 10 includes a serially connected body of battery cells as a single battery, and the terminal voltage, for example, is several hundred volts. As a battery cell, it is possible to use a storage battery such as a lithium-ion battery.

In this embodiment, a battery module is configured as a detection block by integrating a serially connected body of at least two battery cells of the battery cells of the battery pack 10. In this embodiment, a serially connected body of four battery cells 10*a* to 10*d* is configured as a battery module. Moreover, the battery pack may be configured of a serially connected body of n battery modules. In this embodiment, a configuration of a battery pack 10 is presumed in which n is an integer that is 3 or greater. In this embodiment, the battery modules of the battery pack 10 will be referred to in order starting from the low-potential side as the first battery module BM1, the second battery module BM2, . . . , the (n−1)th battery module BMn−1, and the nth battery module BMn.

The voltage-detecting device includes first to nth monitoring units MD1 to MDn, and a control unit 20. Each monitoring unit MD1 to MDn is provided separately to correspond to each battery module BM1 to BMn.

Here, m is defined as an integer that is 1 to n−1. The positive electrode side of the mth battery module BMm and the negative electrode side of the (m+1)th battery module BM(m+1) that is adjacent to the high-potential side of the battery module BMm are electrically connected by an mth conducting member Wm. In this embodiment, the mth conducting member Wm is a wire that functions as a conducting member.

Next, the first to nth monitoring units MD1 to MDn will be explained. In this embodiment, each of the monitoring units MD1 to MDn have the same configuration as each other. Therefore, the configuration of a monitoring unit will be explained using the nth monitoring unit MDn as an example. Moreover, in FIG. 1, reference numbers of each of the members of a monitoring, for convenience will be used in common for each of the monitoring units MD1 to MDn.

The nth monitoring unit MDn includes a circuit board, and first to fifth battery-input units Ci1 to Ci5 are provided on that circuit board. The first to fifth battery-input units Ci1 to Ci5 are provided as terminals. In this embodiment, the first battery-input unit Ci1 corresponds to a "negative-electrode side input unit", and the fifth battery-input unit Ci5 corresponds to a "positive-electrode side input unit".

The nth monitoring unit MDn includes a high-potential electrical path LHM by which the first terminal is electrically connected to the fifth battery-input unit Ci5. Moreover, the nth monitoring unit MDn includes a low-potential electrical path LLM by which the first terminal is electrically connected to the first battery-input unit Ci1, and by which the second terminal is electrically connected to the second terminal of the of the high-potential electrical path LHM.

The negative-terminal side of the nth battery-module BMn is connected to the first battery-input unit Ci1 via a first input path L1, the positive-electrode side of the first battery cell 10*a* and the negative-electrode side of the second battery cell 10*b* are connected to the second battery-input unit Ci2 via a second input path L2. The positive-electrode side of the second battery cell 10*b* and the negative-electrode side of the third battery cell 10*c* are connected to the third battery-input unit Ci3 via a third input path L3, and the positive-electrode side of the third battery cell 10*c* and the negative-electrode side of the fourth battery cell 10*d* are connected to the fourth battery-input unit Ci4 via a fourth input path L4. The positive-electrode side of the nth battery module BMn is connected to the fifth battery-input unit Ci5 via a fifth input path L5.

Each input path L1 to L5 may be integrated in an electrically insulated state from each other, and configured as a harness member.

The nth monitoring unit MDn includes a main voltage-detecting unit 30. The main voltage-detecting unit 30 has a function for separately detecting the terminal voltages of each of the battery cells 10*a* to 10*d* of the nth battery module BMn. In other words, in this embodiment, each battery cell is a "battery to be detected". The main voltage-detecting unit 30 detects the terminal voltage of the first battery cell 10*a* via the first input path L1 and the second input path L2, and detects the terminal voltage of the second battery cell 10*b* via the second input path L2 and the third input path L3. Moreover, the main voltage-detecting unit 30 detects the terminal voltage of the third battery cell 10*c* via the third input path L3 and the fourth input path L4, and detects the terminal voltage of the fourth battery cell 10*d* via the fourth input path L4 and the fifth input path L5. The main voltage-detecting unit 30 includes an AD converter, and converts the detected terminal voltages from analog data to digital data.

In the nth monitoring unit MDn, a first switch SW1 is provided in the high-potential electrical path LHM. In this embodiment, the first switch SW1 is opened and closed by the main voltage-detecting unit 30. In this embodiment, the first switch SW1 is a normally-open semiconductor switching element. A relay, for example, may be used as the first switch SW1.

In the high-potential electrical path LHM, a low-pass filter that includes a resistor and a capacitor may be provided closer to the fifth battery-input unit Ci5 than the first switch SW1 is.

In the high-potential electrical path LHM, a first voltage-dividing resistor 40*a* is provided on the opposite side from the fifth battery-input unit Ci5 across from the first switch SW1. A second voltage-dividing resistor 40*b* is provided in the low-potential electrical LLM. One end of the first voltage-dividing resistor 40*a* and one end of the second voltage-dividing resistor 40*b* are electrically connected.

The nth monitoring unit MDn has a function for detecting the charged state of the nth battery module BMn. In this embodiment, the nth monitoring unit MDn has a function for detecting whether or not the charged state is an overcharged state. In order to achieve this function, the nth monitoring unit MDn includes a comparator 41 and a reference power source 42 that is a direct-current power supply. The reference power source 42 is connected to the non-inverting-input terminal of the comparator 41, and the connecting point of the first voltage-dividing resistor 40*a* and the second voltage-dividing resistor 40*b* is connected to the inverting-input terminal of the comparator 41.

A reference voltage VREF that is the output voltage from the reference power source 42 is set to a value such that it is possible to determine when the nth battery module BMn is in an overcharged state. More specifically, for example, the reference voltage VREF may be set to a value that corresponds to the allowable upper limit of the terminal voltage of the nth battery module BMn. Even more specifically, the reference voltage VREF may be set to a value resulting from dividing the allowable upper limit value by the first and second voltage-dividing resistors 40*a*, 40*b*.

In this embodiment, the first voltage-dividing resistor 40*a*, the second voltage-dividing resistor 40*b*, the comparator 41 and the reference power source 42 form the "sub voltage-detecting unit".

The nth monitoring unit MDn includes a communication power source 43 that is a direct-current power source, a communication resistor 44, and a photocoupler 45 as a "communication switch". The communication power source 43 is connected to the first end of the communication resistor 44, and the anode of a photodiode of the photocoupler 45 is connected to the second end of the communication resistor 44. The output terminal of the comparator 41 is connected to the cathode of the photodiode.

A signal-output unit Ca of the nth monitoring unit MDn is connected to the collector of a phototransistor of the photocoupler 45, and ground of the power-source system is connected to the emitter of the phototransistor. In this embodiment, the signal-output unit Ca is configured as a terminal.

The nth monitoring unit MDn includes a DA converter 46 that corresponds to a "voltage-generating unit", and a second switch SW2 that is provided in the electrical path that connects the DA converter 46 and the inverting-input terminal of the comparator 41. In this embodiment, the second switch SW2 is opened and closed by the main voltage-detecting unit 30. In this embodiment, the second switch SW2 is a normally-open type semiconductor switching element. As the second switch SW2, it is possible, for example, to use a relay. In this embodiment, the DA converter 46, for example, is used for correcting the voltage that is detected by the main voltage-detecting unit 30.

In this embodiment, the main voltage-detecting unit 30, the first switch SW1, the first voltage-dividing resistor 40*a*, the second voltage-dividing resistor 40*b*, the DA converter 46 and the second switch SW2 are configured as a monitoring IC 60 that is one integrated circuit. Moreover, in this embodiment, the comparator 41 and the reference power source 42 are configured as a redundant IC 70 that is one integrated circuit. The redundant IC 70 is configured on a different chip than the monitoring IC 60.

The monitoring IC 60 and the redundant IC 70 will be explained using FIG. 2 and FIG. 3.

As illustrated in the figures, both the monitoring IC 60 and the redundant IC 70 have a flat rectangular parallelepiped shape in the thickness direction. In the monitoring IC 60, one of the two outer surfaces of which the thickness direction is the normal direction is taken to be the rear monitoring surface 60*a*, and the other surface is taken to be the front monitoring surface 60*b*. In the redundant IC 70, one of the two outer surfaces of which the thickness direction is the normal direction is taken to be the rear redundant surface 70*a*, and the other surface is taken to be the front redundant surface 70*b*.

The surface area of the front monitoring surface 60*b* is larger than the surface area of the rear redundant surface 70*a*. Moreover, in this embodiment, the front monitoring surface 60*b* and the rear redundant surface 70*a* are flat surfaces with no unevenness. In this configuration, the entire surface of the rear redundant surface 70*a* is brought into contact with the front monitoring surface 60*b*, and in this state, the redundant IC 70 is attached to the center section of the monitoring IC 60. The redundant IC 70 may be mechanically connected to the monitoring IC by applying an adhesive between the rear redundant surface 70*a* and the front monitoring surface 60*b*.

The reason that the redundant IC 70 is attached to the monitoring IC 60 in a state in which the entire surface of the rear redundant surface 70*a* is in contact with the front monitoring surface 60*b* is to prevent a decrease in the voltage-detecting precision of the main voltage-detecting unit 30 of the monitoring IC 60.

In other words, a detection block is the object of voltage detection by the sub voltage-detecting unit that includes the first voltage-dividing resistor 40*a*, the second voltage-dividing resistor 40*b*, the comparator 41 and the reference power source 42, however, the object of voltage detection by the main voltage-detecting unit 30 are the battery cells 10*a* to 10*d*. Therefore, the voltage-detecting precision that is required for the main voltage-detecting unit 30 is higher than the voltage-detecting precision required for the sub voltage-detecting unit. Here, by stress acting on the monitoring IC 60, the monitoring IC 60 may be distorted. When the monitoring IC 60 is distorted, the voltage-detecting precision of the main voltage-detecting unit 30 of the monitoring IC 60 may decrease.

Therefore, the redundant IC 70 is attached to the monitoring IC 60 in a state in which the entire surface of the rear redundant surface 70*a* is in contact with the front monitoring surface 60*b*. In doing so, even when stress acts on the monitoring IC 60, the redundant IC 70 makes it possible to suppress the monitoring IC 60 from becoming distorted. As a result, it is possible to prevent a decrease in the voltage-detecting precision of the main voltage-detecting unit 30 of the monitoring IC 60.

In this embodiment, the front monitoring surface 60*b* and the rear redundant surface 70*a* are both flat surfaces with no unevenness, however these surfaces are not limited to this. For example, an uneven portion may be formed in at least one of part of the portion of the front monitoring surface 60*b* that overlaps the redundant IC 70, and part of the rear redundant surface 70*a*. In this case, configuration is employed in which, when viewing the monitoring IC 60 from the front monitoring surface 60*b*, the contour of the redundant IC 70 does not protrude from the contour of the monitoring IC 60, and in this state, the rear redundant surface 70*a* is attached with adhesive or the like to the front monitoring surface 60*b*. With this configuration as well, it is possible to suppress distortion of the monitoring IC 60.

In this embodiment, the monitoring IC 60 and the redundant IC 70 are packaged using a lead frame 80 and bonding wire together with molding resin 100 that is a sealing material, to form a semiconductor module. The molding resin 100 is configured using a synthetic resin material that has an electrical insulating property; for example, epoxy resin.

The lead frame 80 is a plate shaped member that is made using a conductive material, and includes a die pad 80*a*, suspended leads 80*b* and leads 80*c*. The die pad 80*a* is positioned in the center section of the lead frame 80 and has a rectangular shape. The suspended leads 80*b* are four members that extend from the die pad 80*a* toward the outside along diagonal lines. The leads 80*c* are long members that extend toward the center section of the die pad 80*a*, and plural leads 80*c* are provided between adjacent suspended leads 80*b* around the perimeter of the die pad 80*a*.

The leads 80*c* include inner leads 80*c*1 that are positioned inside the molding resin 100, and outer leads 80*c*2 that are exposed from the molding resin 100. The inner leads 80*c* extend in a direction parallel to the extending direction of the die pad 80*a*. The outer leads 80*c*2 bend downward, and the tip-end sections thereof extend in a direction parallel to the extending direction of the inner leads 80*c*1.

When the monitoring IC 60 is viewed from the front monitoring surface 60*b*, plural electrode pads are formed along each edge of the front monitoring surface 60b in the area of the front monitoring surface 60b that does not overlap with the redundant IC 70. FIG. 3 illustrates the plural electrode pads 61 that are formed along one specific edge of the four edges of the front monitoring surface 60b. In this embodiment, a power-supply terminal for supplying electrical power to the monitoring IC 60 is included in the plural electrode pads 61 that are formed along this one specific edge. On the other hand, on the front redundant surface 70b of the redundant IC 70, plural electrode pads 71 are formed along one edge of the front redundant surface 70b. In this embodiment, a power-supply terminal for supplying electrical power to the redundant IC 70 is included in the plural electrode pads 71 that are formed along this one specific edge. Moreover, in this embodiment, the redundant IC 70 is attached to the monitoring IC 60 in a state in which, taking the center section of the redundant IC 70 as a reference, the electrode pads 71 of the redundant IC 70 and the electrode pads 61 of the monitoring IC 60 face in the same or nearly the same direction.

In this embodiment, of the inner leads 80c1 that are arranged along each edge of the die pad 80a, one of the inner leads 80c1 that faces from the electrode pads 61, 71 is used in common by the monitoring IC 60 and redundant IC 70, and is a power-source terminal that is the power-supply source for each IC 60, 70. This power-source terminal and the power-supply terminal of the electrode pads 61 of the monitoring IC 60 are electrically connected by a bonding wire 90. Moreover, this power-source terminal and the power-supply of the electrode pads 71 of the redundant IC 70 are electrically connected by a bonding wire 91. This configuration is employed in order for the effect of reducing the number of electrode pads of the monitoring 60 and reducing the number of connections using bonding wire. In the following, this effect will be explained while comparing this embodiment with related technology.

Figure 3:
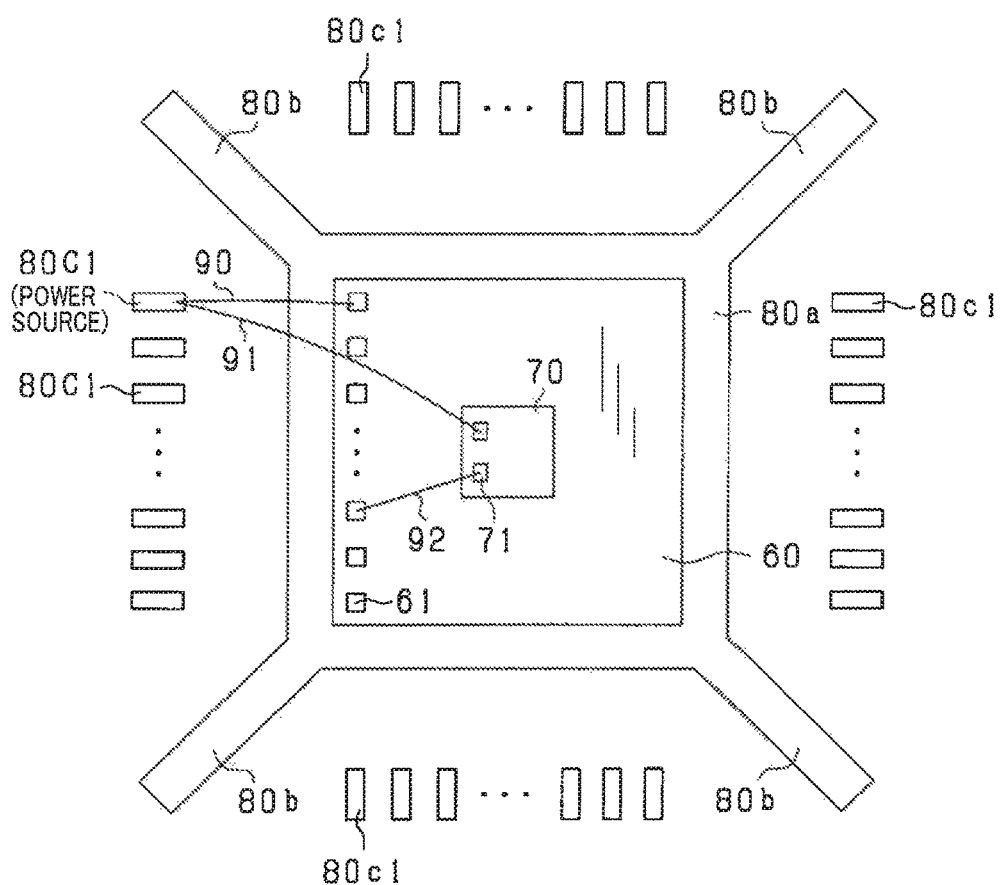
FIG. 3 is a plan view of the configuration of part of a semiconductor module.
Figure 4:
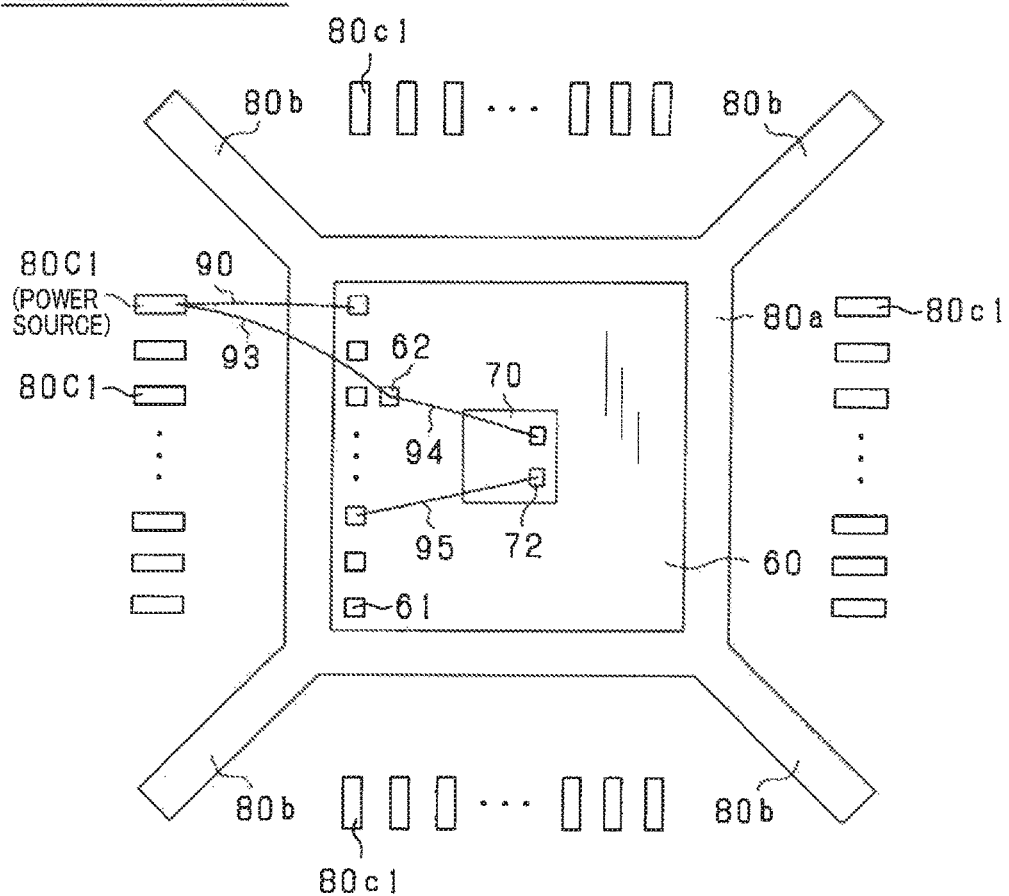
FIG. 4 is a plan view of the configuration of part of a semiconductor module according to related technology.

FIG. 4 illustrates part of a semiconductor module according to related technology. In FIG. 4, for convenience, the same reference numbers are used for configuration that is the same as the configuration illustrated in FIG. 3.

As illustrated in FIG. 4, in related technology, the redundant IC 70 is attached to the monitoring IC 60 in a state in which the electrode pads 72 of the redundant IC 70 and the electrode pads 61 of the monitoring IC 60 face opposite directions with the center section of the redundant IC 70 as a reference. In the configuration illustrated in FIG. 4, when the monitoring IC 60 is viewed from the front monitoring surface 60b, the distance between the electrode pad 72 of the front redundant surface 70b and the inner pad 80c1 that is the power-source terminal becomes longer than in the configuration illustrated in FIG. 3. In this case, when the lead 80c that is the power-source terminal and the electrode pad 72 of the front redundant surface 70b are directly connected by one bonding wire, there is a possibility that the bonding wire could break. In order to prevent breakage of the bonding wire, the center section of the bonding wire is bent in an arc shape in the thickness direction of the redundant IC 70, and in this state it is necessary to connect the lead 80c that is the power-source terminal and the electrode pad 72 of the front redundant surface 70b. However, in this case, the bonding wire that is bent in the thickness direction becomes sealed by the resin molding, and so the dimension in the thickness direction of the semiconductor modules increases.

In order to avoid this problem, as illustrated in FIG. 4, an electrode pad 62 that functions as a relay may be formed on the front monitoring surface 60b of the monitoring IC 60. Then, it is possible to employ a configuration in which, together with connecting the electrode pad 72 of the front redundant surface 70b and the electrode pad 62 that functions as a relay by a bonding wire 94, the electrode pad 62 that functions as a relay and the lead 80c1 that is the power-source electrode are connected by a bonding wire 93. However, in this configuration it is necessary to form an extra electrode pad 62 that functions as a relay on the monitoring IC 60. Moreover, in this configuration, the number of operations for connecting between electrode pads with bonding wire increases.

In this embodiment, however, the configuration illustrated in FIG. 3 is employed. As a result, when the monitoring IC 60 is viewed from the front monitoring surface 60, the distance between the electrode pad 71 of the front redundant surface 70b and the lead 80c1 that is the power-source terminal can be shortened more than in the configuration illustrated in FIG. 4. Therefore, the electrode pad 71 of the redundant IC 70 and the lead 80c1 that is the power-source terminal can be directly connected by one bonding wire 91. As a result, it is not necessary to form an electrode pad 62 to function as a relay on the monitoring IC 60, and so it is possible to reduce the number of electrode pads that are formed on the monitoring IC 60. Moreover, it is possible to prevent an increase in the number of operations for connecting with bonding wire.

In FIG. 3, the bonding wire 92 is a wire that connects the DA converter 46 of the monitoring IC 60 and the comparator 41 of the redundant IC 70. Moreover, in FIG. 4, the bonding wire 95 corresponds to the bonding wire 92 in FIG. 3.

Returning to the explanation of FIG. 1, the voltage-detecting device includes a common power source 50 that is a direct-current power source, and a common communication line 51 that is a communication line that is connected to the common power source 50. A common resistor 52 that is a resistor is provided on the common communication line 51. On the common communication line 51, individual communication lines 53 that are connected to the respective signal-output units Ca of the monitoring units MD1 to MDn are connected to the opposite side from the common power source 50 across from the common resistor 52.

The control unit 20 includes a signal-input unit Cb, a first communication-connecting unit T1 and a second communication-connecting unit T2 that are terminals. On the other hand, the first to nth monitoring units MD1 to MDn include a communication-input unit TI and a communication-output unit TO that are terminals. In this embodiment, in each of the monitoring units MD1 to MDn, the communication-input unit TI and the communication-output unit TO are electrically connected to the monitoring IC 60.

The control unit 20 and the first to nth monitoring units MD1 to MDn have a communication function. The first communication-connecting unit T1 of the control unit 20 and the communication-input unit TI of the nth monitoring unit MDn, the communication-output unit TO of the (m+1)th monitoring unit MDm+1 (m=1, 2, . . . , n−1) and the communication-input unit TI of the mth monitoring unit MDm, and the communication-output unit TO of the first monitoring unit MD1 and the second communication-connecting unit T2 of the control unit 20 are respectively connected by a communication line CCL. In other words, the control unit 20 and the monitoring ICs 60 of the first to nth monitoring units MD1 to MDn are connected using a daisy chain method.

The terminal voltage of each battery cell that is detected by the main voltage-detecting unit 30 of each monitoring unit MD1 to MDn as digital data is inputted to the control unit 20 via the communication line CCL and the second communication-connecting unit T2.

The control unit 20 performs a charged-state-determining process for determining whether or not there is a battery module among the first to nth battery modules BM1 to BMn that is in an overcharged state. This process will be explained in the following.

The control unit 20 first outputs an instruction to the monitoring IC of each of the monitoring units MD1 to MDn via the first communication-connecting unit T1 and communication line CCL to close the first switches SW1 and to open the second switches SW2. As a result, the first switch SW1 of each of the monitoring units MD1 to MDn is set to the closed state, and the second switch SW2 is set to the open state.

Then, based on the input signal VM of the signal-input unit Cb, the control unit 20 determines whether or not there is a battery module among the first to nth battery modules BM1 to BMn that is in an overcharged state. The nth battery module that corresponds to the nth monitoring unit MDn will be explained as an example, and when the nth battery module is not in an overcharged state, the terminal voltage of the nth battery module BMn that is divided by the first voltage-dividing resistor 40a and the second voltage-dividing resistor 40b becomes lower than the reference voltage VREF that is outputted from the reference power source 42. Therefore, the logic of the output signal from the comparator 41 is H, and current does not flow from the communication power source 43 to the output terminal side of the comparator 41 via the communication resistor 44 and photodiode of the photocoupler 45. As a result, the phototransistor of the photocoupler 45 is set to an open state, and current does not flow from the common power source 50 to ground via the common communication line 51, the individual communication line 53, the signal-output unit Ca and the phototransistor. As a result, the logic of the input signal VM of the signal-input unit Cb is H. When it is determined that the logic of the input signal VM of the signal-input unit Cb is H, the control unit 20 determines that none of the first to nth battery modules BM1 to BMn are in an overcharged state.

However, when the nth battery module is in an overcharged state, the terminal voltage of the nth battery module BMn that is divided by the first voltage-dividing resistor 40a and the second voltage-dividing resistor 40b becomes higher than the reference voltage VREF that is outputted from the reference voltage source 42. Therefore, the logic of the output signal of the comparator 41 is L, and current flows from the communication power source 43 to the output terminal side of the comparator 41 via the communication resistor 44 and the photodiode of the photocoupler 45. As a result, the phototransistor of the photocoupler 45 is switched from an open state to a closed state, and current flows from the common power source 50 to ground via the common communication line 51, the individual communication line 53, the signal-output unit Ca and the phototransistor. As a result, the logic of the input signal VM of the signal-input unit Cb is inverted from H to L. When it is determined that the logic of the input signal VM of the signal-input unit Cb is L, the control unit 20 determines that at least one of the first to nth battery modules BM1 to BMn is in an overcharged state.

Continuing, a diagnostic process that is executed by the control unit 20 will be explained.

First, the diagnostic process of the reference power source 42 will be explained using FIG. 5. This process is executed by the control unit 20 when it is determined that a specified diagnosis-execution condition is established. Here, the diagnosis-execution condition, for example, may be a condition in which a specified amount of time has elapsed since the previous diagnostic process was executed.

In this series of processing, first, in step S10, the control unit 20 outputs an instruction to each of the monitoring units MD1 to MDn to open the first switch SW1 and an instruction to close the second switch SW2. As a result, in each monitoring unit MD1 to MDn, the first switch SW1 is set to an open state, and the second switch SW2 is set to a closed state.

Next, in step S12, the control unit 20 outputs an instruction to the DA converter 46 of each monitoring unit MD1 to MDn to change the diagnostic voltage VT so that the reference voltage VREF spans from bottom to top. Then, in step S14, the control unit 20 determines whether or not the logic of the input signal VM of the signal-input unit Cb is inverted from H to L before and after changing the diagnostic voltage VT.

In step S14, when it is determined that the logic of the input signal VM is inverted from H to L, processing advances to step S16, and the control unit 20 determines that no abnormality has occurred in the reference power source 42. However, in step S14, when it is determined that the logic of the input signal VM is inverted from H to L, processing advances to step S18, and the control unit 20 determines that an abnormality has occurred in the reference power source 42.

When it is determined that an abnormality has occurred in the reference power source 42, the control unit 20 may prohibit voltage detection by the sub voltage-detecting unit.

Continuing, the diagnostic process of the communication system from the comparator 41 to the signal-input unit Cb via the photocoupler 45, the signal-output unit Ca, and individual-communication line 53 and the common-communication line 51 will be explained using FIG. 6. This process is executed when it is determined by the control unit 20 that a specified diagnosis-execution condition is established. Here, the diagnosis-execution condition, for example, may be a condition in which a specified amount of time has elapsed since execution of the previous diagnostic process.

In this series of processing, after the processing in step S10 is complete, processing advances to step S20, and the control unit 20 outputs an instruction to the DA converter 46 of each monitoring unit MD1 to MDn to set the diagnostic voltage VT to a voltage lower than the reference voltage VREF. Then, in step S22, the control unit 20 determines whether or not the logic of the input signal VM of the signal-input unit Cb is H.

In step S14 when it is determined that the logic of the input signal VM is H, processing advances to step S24, and the control unit 20 determines that no abnormality has occurred in the communication system. On the other hand, in step S22, when it is determined that the logic of the input signal VM is L, processing advances to step S26, and the control unit 20 determines that an abnormality has occurred in the communication system.

When it is determined that an abnormality has occurred in the communication system, the control unit 20 may prevent voltage detection by the sub voltage-detecting unit.

With the embodiment described in detail above, the following effects are obtained.

(1) Each monitoring unit MS1 to MDn includes a main voltage-detecting unit 30, and first and fifth battery-input units Ci1, Ci5, a sub voltage-detecting unit for detecting the terminal voltage of each battery module BM1 to BMn via the first battery-input unit Ci1 and fifth battery-input unit Ci5. The sub voltage-detecting unit includes each voltage-dividing resistor 40*a*, 40*b*, a comparator 41 and a reference voltage source 42. A sub voltage-detecting unit is included in each monitoring unit MD1 to MDn, so differing from configuration in which a sub voltage-detecting unit is included in the control unit 20, it is not necessary to provide n number of voltage-input units equal to the number of battery modules in the control unit 20 for electrically connecting each battery module and the control unit 20. Therefore, even when the number of battery modules changes due to changes in the specifications of the battery pack 10, it is possible to use a common control unit 20 that constitutes the voltage-detecting device.

(2) The surface area of the front monitoring surface 60*b* of the monitoring IC 60 is larger than the surface area of the rear redundant surface 70*a* of the redundant IC 70. The redundant IC 70 is attached to the monitoring IC 60 in a state in which the entire surface of the rear redundant surface 70*a* is in contact with the front monitoring surface 60*b*. Therefore, it is possible to suppress distortion of the monitoring IC 60 by the entire surface of the rear redundant surface 70*a*. As a result, it is possible to prevent a decrease in voltage-detecting precision by the main voltage-detecting unit 30.

Furthermore, a redundant IC is provided on the front monitoring surface 60*b* of the monitoring IC 60, so it is possible to reduce the required mounting surface area for each detecting unit when including a main voltage-detecting unit 30 and sub voltage-detecting unit in each monitoring unit MD1 to MDn. As a result, it is possible to make each monitoring unit MD1 to MDn more compact, and thus it is possible to make the voltage-detecting device more compact.

(3) Plural electrode pads 61 are formed along one edge of the front monitoring surface 60*b*, and plural electrode pads 71 are formed along one edge of the front redundant surface 70*b*. The redundant IC 70 is attached to the monitoring IC 60 in a state in which the electrode pads 71 of the redundant IC 70 and the electrode pads 61 of the monitoring IC 60 face in the same direction or nearly the same direction. With this configuration, when the monitoring IC 60 is viewed from the front monitoring surface 60*b*, it is possible to shorten the distance between an electrode pad 71 of the front redundant surface 70 and a lead 80*c*1 that is the power-source terminal. Therefore, each respective electrode pad 71 of the redundant IC 70 and electrode pad 61 of the monitoring IC 60 can be directly connected to a common lead 80*c*1 by a bonding wire. As a result, it is possible to reduce the number of electrode pads that are formed on the monitoring IC 60, and thus it is possible to prevent an increase in the number of operations for connecting bonding wire.

(4) Each monitoring unit MD1 to MDn includes a signal-output unit Ca and photocoupler 45. Moreover, the voltage-detecting device includes a common power source 50 and a common resistor 52. Then, of both ends of the common resistor 52, the signal-input unit Cb of the control unit 20 is electrically connected to the opposite side from the common power source 50. With this configuration, it is not necessary to change the number of signal-input units Cb of the control unit 20 even when the number of battery modules changes due to changes in specifications of the battery pack 10. Therefore, even when the specifications of the battery pack 10 change, it is possible to make the control unit 20 of the voltage-detecting device common.

This configuration is effective in reducing the communication lines for connecting each monitoring unit MD1 to MDn and control unit 20 when each battery cell is mounted in separated spaces inside a vehicle. Here, separated spaces inside a vehicle, for example, includes space that is located below the seats, and space that is located below the trunk at the rear of the vehicle.

(5) By having the voltage that is divided by the first and second voltage-dividing resistors 40*a*, 40*b* span the reference voltage VREF from bottom, the logic of the output signal of the comparator 41 is inverted. Then, configuration is such that the output signal from the comparator 41 of each monitoring unit MD1 to MDn is inputted to the signal-input unit Cb via the photocoupler 45, signal-output unit Ca, individual communication line 53 and common communication line 51. Therefore, when the logic of the output signal of at least one comparator 41 of the monitoring units MD1 to MDn is inverted, the logic of the input signal VM of the signal-input unit Cb is inverted. Therefore, the control unit 20 can determine an overcharged state of a battery module based on the input signal VM of the signal-input unit Cb.

Furthermore, in this embodiment, until the voltage that is divided by the first and second voltage-dividing resistors 40*a*, 40*b* span the reference voltage VREF from the bottom to the top, the logic of the output signal of the comparator 41 is H. Therefore, until the state of one of the battery modules becomes an overcharged state, it is possible to not allow current to flow to the photodiode of the photocoupler 45, and this it is possible to reduce the power consumption of the voltage-detecting device.

(6) In a state in which the first switches SW1 are set to the open state and the second switches SW2 are set to the closed state, the control unit 20 changes the diagnostic voltage to span the reference voltage VREF from bottom to top. Then, when the diagnostic voltage VT is changed and it is determined that the logic of the input signal VM of the signal-input unit Cb is not inverted, the control unit 20 determines that an abnormality has occurred in the reference power source 42. As a result, it is possible to properly determine whether or not there is an abnormality in the reference power source 42, and it is possible to prevent continued used of the voltage-detecting device in a state in which an abnormality has occurred in the reference power source 42.

(7) In a state in which the first switches SW1 are set to the open state and the second switches SW2 are set to the closed state, the control unit 20 sets the diagnostic voltage VT to a voltage that is lower than the reference voltage VREF. Then, when it is determined that the logic of the input signal VM is L, the control unit 20 determines that an abnormality has occurred in the communication system. As a result, it is possible to properly determine whether or not there is an abnormality in the communication system, and it is possible to prevent continued used of the voltage-detecting device in a state in which an abnormality has occurred in the communication system.

(8) Configuration is such that a DA converter 46 is provided in the monitoring IC 60. Therefore, it is not necessary to include a separate DA converter in the redundant IC 70 for diagnosis. As a result it is possible to simplify the circuit for diagnosis.

(Second Embodiment)

Figure 7:
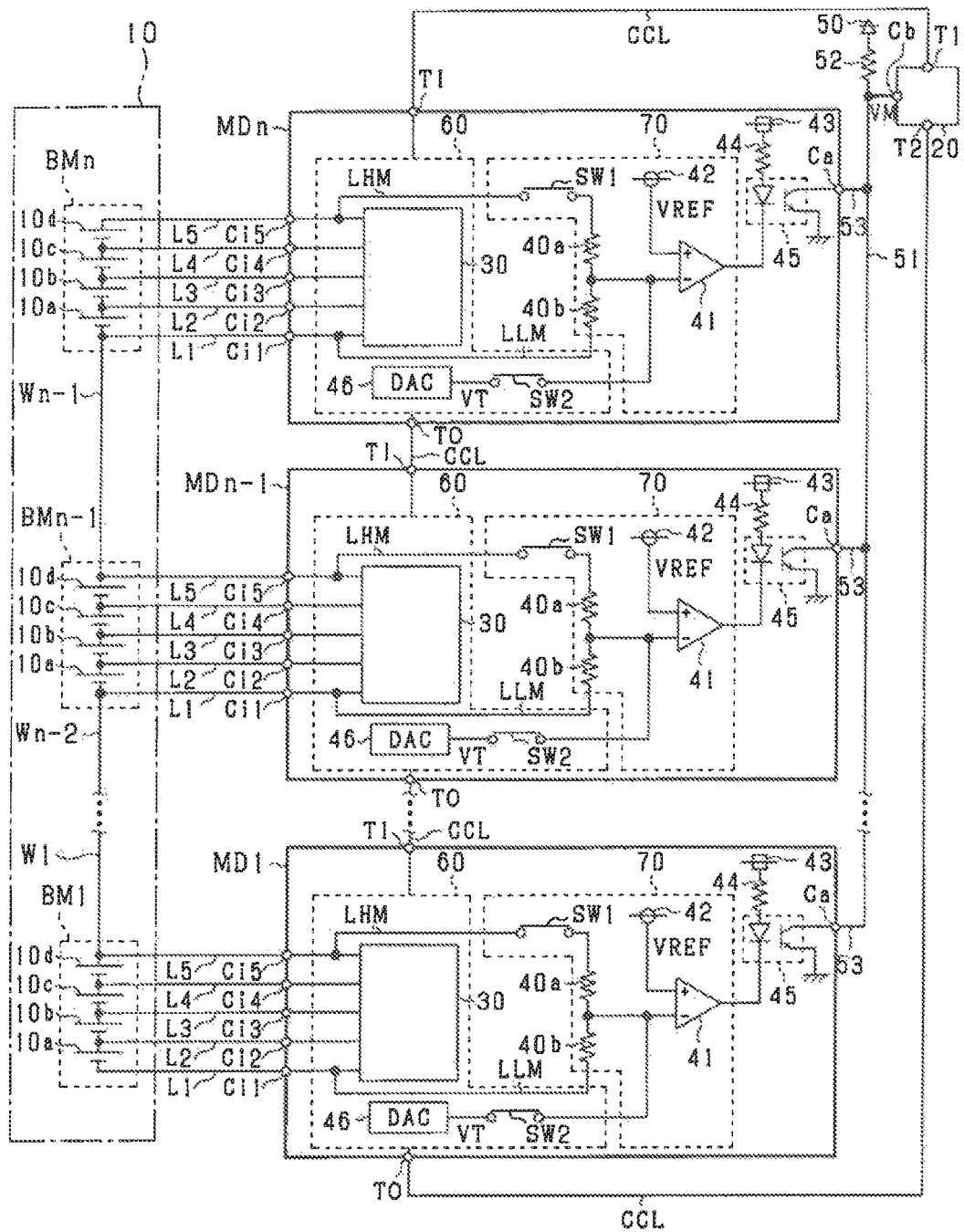
FIG. 7 is an overall configuration diagram of the power-source system according to a second embodiment.

In the following, a second embodiment will be explained with reference to the drawings, and centering on differences with the first embodiment. In this embodiment, as illustrated in FIG. 7, the main voltage-detecting unit 30, the DA converter 46 and the second switch SW2 are configured as the monitoring IC 60 that is one integrated circuit. In other words, the first switch SW1, and each of the voltage-dividing resistors 40*a*, 40*b* do not configure the monitoring IC 60. On the other hand, the first switch SW1, the first voltage-dividing resistor 40*a*, the second voltage-dividing resistor 40b, the comparator 41 and the reference power source 42 are configured as the redundant IC 70 that is one integrated circuit. In FIG. 7, for convenience, the same reference numbers are given to configuration that is the same as the configuration illustrated in FIG. 1.

Incidentally, in this embodiment, the first switches SW1, for example, may be opened or closed by the main voltage-detecting unit 30 that receives an instruction from the control unit 20.

With this embodiment as explained above, it is also possible to obtain the same effect as the first embodiment described above.

(Other Embodiments)

The embodiments described above may also be changed as described below.

Figure 2:
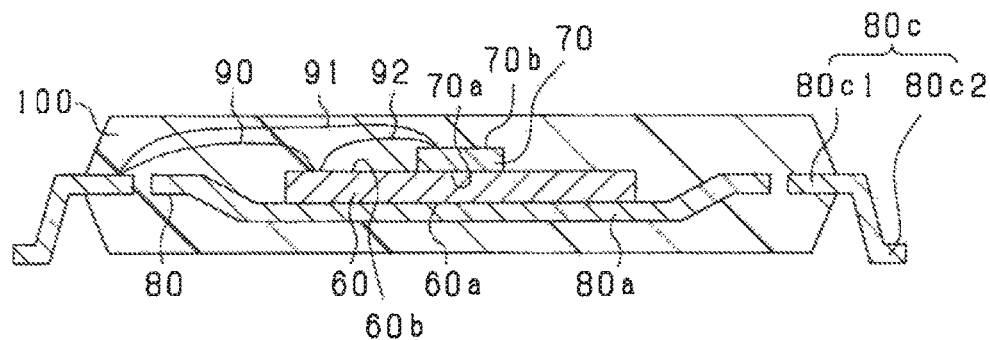
FIG. 2 is a cross-sectional view of a semiconductor module.
Figure 8:
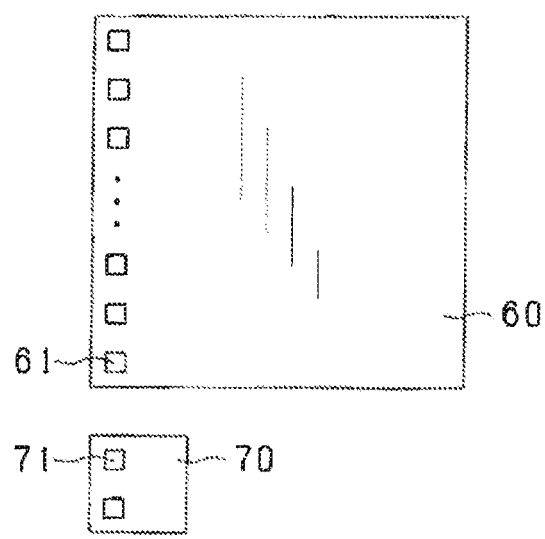
FIG. 8 is a plan view of the configuration of part of a semiconductor module according to other embodiments.

- The method for arranging the monitoring IC 60 and the redundant IC 70 is not limited to the method illustrated in FIG. 2 and FIG. 3. For example, as illustrated in FIG. 8, the method for arranging the monitoring IC 60 and the redundant IC 70 may be such that when the monitoring IC 60 is viewed from the front monitoring surface 60b, both the monitoring IC 60 and the redundant IC 70 are mounted on a die pad 80a, and are placed side by side inside a resin mold. In FIG. 8, for convenience, the same reference numbers are used for configuration that is the same as the configuration illustrated in FIG. 2 and FIG. 3.
- The monitoring IC 60 and the redundant IC 70 are not limited to being configured as separate integrated circuits. For example, in the first embodiment above, the main voltage-detecting unit 30, the first switch SW1, the first voltage-dividing resistor 40a, the second voltage-dividing resistor 40b, the DA converter 46, the second switch SW2, the comparator 41 and the reference power source 42 are configured as the same integrated circuit. On the same integrated circuit, a group of the main voltage-detecting unit 30, the first switch SW1, the first voltage-dividing resistor 40a, the second voltage-dividing resistor 40b, the DA converter 46, and the second switch SW2, and a group of the comparator 41 and the reference power source 42 are separated.
- In the first embodiment above, the output terminal of the comparator 41 and the signal-output unit Ca are electrically insulated, and a photocoupler 45 as an optical insulating element is used as an insulating unit for transmitting signals between the output terminal of the comparator 41 and the signal output unit Ca, however, configuration is not limited to this. For example, another insulating element such as a magnetic coupler as a magnetic insulating element and the like may be used.
- As the charged-state-determining process that is executed by the control unit 20, processing for determining whether or not there is a battery module among the first to nth battery modules that is in an overcharged state may be performed. In this case, the reference voltage VREF may be set to a value such that it is possible to determine that a battery module is in an overcharged state. More specifically, for example, the reference voltage VREF may be set to a value that is obtained by dividing the lower allowable limit of the terminal voltage of a battery module by the first and second voltage-dividing resistors 40a, 40b. In this setting, the reference power source 42 may connected to the inverting input terminal of the comparator 41, and connecting point between each of the voltage-dividing resistors 40a, 40b may be connected to the non-inverting input terminal. With this configuration, the voltage that is divided by the voltage-dividing resistors 40a, 40b is such that by spanning the reference voltage VREF from bottom to top, the logic of the output signal of the comparator 41 is inverted from H to L. Therefore, in the same way as determining and overcharged state, the control unit 20, based on the input signal VM of the signal-input unit Cb, is able to determine that at least one battery modules is in an overcharged state.

Figure 5:
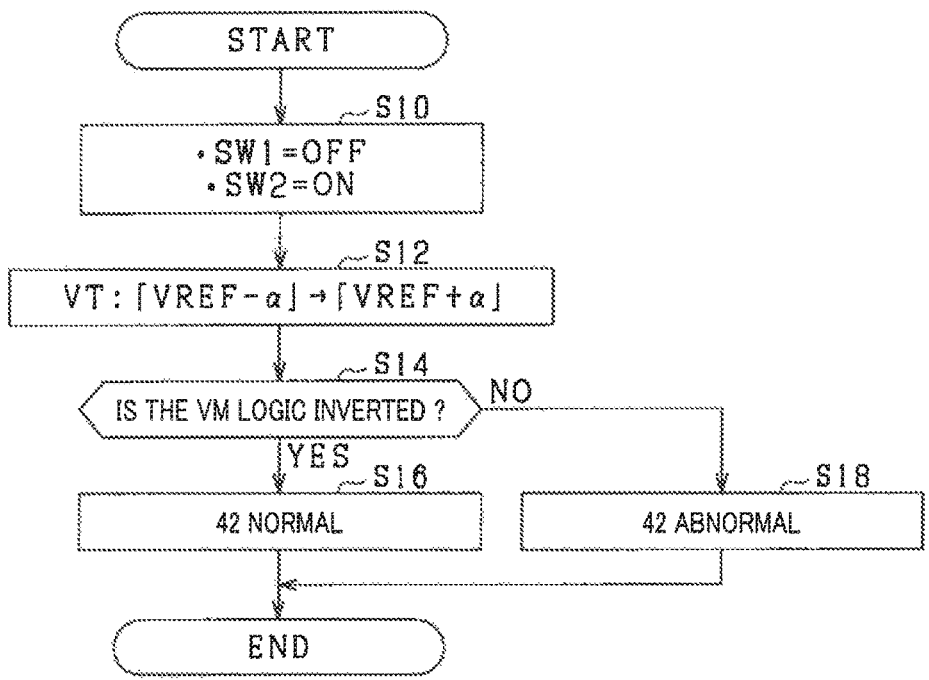
FIG. 5 is a flowchart illustrating the procedure of a diagnostic process according to a first embodiment.

In this configuration, it is possible to perform the diagnostic process illustrated in FIG. 5. In this case, the processing of step S12 may be changed to processing that changes the diagnostic voltage VT so as to span the reference voltage VREF from top to bottom.

Figure 6:
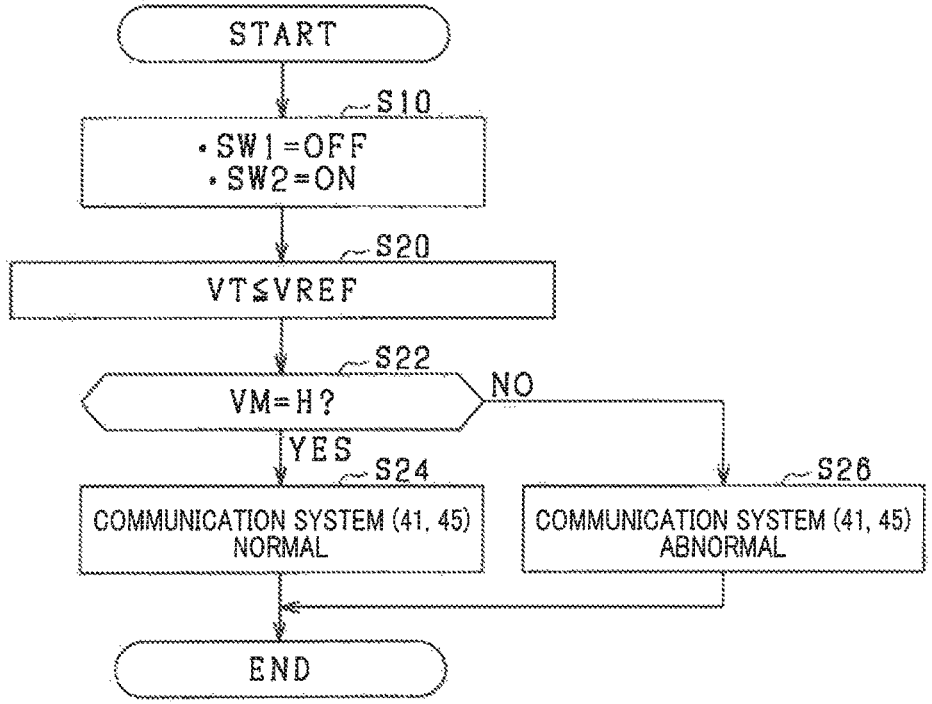
FIG. 6 is a flowchart illustrating the procedure of a diagnostic process.

Moreover, in this configuration, it is possible to perform the diagnostic processing illustrated in FIG. 6. In this case, the processing of step S20 may be changed to processing that changes to the diagnostic voltage VT to a voltage that is higher than the reference voltage VREF.

- In the first embodiment above, the connecting point between the first and second voltage-dividing resistors 40a, 40b and one end of the second switch SW2 may be connected to the non-inverting input terminal of the comparator 41, and the reference power source 42 may be connected to the inverting input terminal. In this case, when there is no battery module in an overcharged state, the logic of the output signal of the comparator 41 becomes L, and the photodiode of the photocoupler 45 is set to a conducting state.
- In the first embodiment above, the output signal of the comparator 41 of the sub voltage-detecting unit, and the detected voltage value of the main voltage-detecting unit 30 are transmitted to the control unit 20 using separate communication systems, however, configuration is not limited to this, and configuration may be such that these values are transmitted to the control unit 20 using the same communication system. More specifically, as this kind of configuration for example, the communication power source 43, the communication resistor 44, the photocoupler 45, and the signal-output unit Ca may be removed from each monitoring unit MD1 to MDn, and the communication line CCL of the daisy chain connection may be used to transmit the output signal of the comparator 41 to the control unit 20.
- In the first embodiment above, the control unit 20 may perform a process for determining abnormality of the first voltage-dividing resistor 40a and second voltage-dividing resistor 40b. This processing, for example, may be processing in which it is determined that abnormality has occurred in at least one of the first voltage-dividing resistor 40a and second voltage-dividing resistor 40b when it is determined that the total voltage of the battery cells 10a to 10d detected by the main voltage-detecting unit 30 and the terminal voltage of the battery module that is converted from the divided voltage value of the first and second voltage-dividing resistors 40a, 40b deviate.
- In the first embodiment above, the surface area of the front monitoring surface 60b and the surface area of the rear redundant surface 70a may be the same. In this case as well, it is possible to obtain the configuration of (2) of the first embodiment.
- In the first embodiment above, the redundant IC 70 is provided in the center section of the monitoring IC 60, however, configuration is not limited to this, and, for example, the redundant IC 70 may be provided in a position shifted from the center section of the monitoring IC 60.

The main voltage-detecting unit is not limited to a voltage-detecting unit that individually detects the terminal voltage of each battery cell of a battery module, and may be a voltage-detecting unit that detects the terminal voltage of a serially connected body of battery cells, the number of which is less than the number of battery cells of the battery module. For example, in FIG. 1, the main voltage-detecting unit may detect the terminal voltage for each serially connected body of two battery cells of the battery module.

The number of battery cells of a battery module is not limited to four, and may be two, three or five or more. Moreover, the number of battery cells of a battery module does not need to be the same for each battery module.

The number of battery modules of the battery pack 10 is not limited to being plural and may be one. In this case, for example, the voltage-detecting device may include one monitoring unit.

The battery pack is not limited to including one serially connected body of plural battery cells. For example, the battery pack may include plural serially connected bodies of plural battery cells, and serially connected bodies may be connected parallel to each other.

The first switch SW1 and the second switch SW2 are not limited to being relays, and for example, a N-channel MOSFET and a P-channel MOSFET of which the sources are connected, an analog switch or a photo relay may be used.

The inner lead of the plural inner leads 80*c*1 that is used in common by the monitoring IC 60 and the redundant IC 70 is not limited to being the power source terminals of both the monitoring IC 60 and the redundant IC 70, and for example, may be a common ground terminal and the like, or some other terminal.

The battery cells, for example, may be nickel-metal hydride storage batteries.

What is claimed is:

1. A voltage-detecting device that is applied to a battery pack that includes a serially connected body of plural battery cells, comprising:
    monitoring units for detecting a state of the battery pack; and
    a control unit that is separately provided from the monitoring units, and to which detection results of the monitoring units are inputted; wherein
    serially connected bodies of at least two of the battery cells of the battery cells of the battery pack form detection blocks;
    each of the respective battery cells of a detection block, or a serially connected body of a number of battery cells in a detection block that is less than the number of the battery cells of the detection block is taken to be a battery for which voltage is to be detected; and
    the monitoring units comprise:
    a main voltage-detecting unit for detecting terminal voltage of each of the batteries for which voltage is to be detected as the state of the battery pack;
    a positive-electrode-side input unit that is electrically connected to a positive-electrode side of a detection block;
    a negative-electrode-side input unit that is electrically connected to a negative-electrode side of a detection block; and
    sub voltage-detecting units for detecting terminal voltage of the detection blocks via the positive-electrode-side input units and the negative-electrode-side input units as the state of the battery pack, wherein
    the main voltage-detecting unit comprises a monitoring IC that is an integrated circuit having a rectangular parallelepiped shape that is flat in the thickness direction;
    at least part of the sub voltage-detecting unit comprises a redundant IC that is a separate integrated circuit from the monitoring IC and has a rectangular parallelepiped shape that is flat in the thickness direction;
    of the monitoring IC, one of the two outer surfaces of which the thickness direction is the normal direction is taken to be a rear monitoring surface and the other surface is taken to be a front monitoring surface;
    of the redundant IC, one of the two outer surfaces of which the thickness direction is the normal direction is taken to be a rear redundant surface and the other surface is taken to be a front redundant surface;
    a surface area of the front monitoring surface is greater than a surface area of the rear redundant surface; and
    the rear redundant surface is mechanically connected to the front monitoring surface in a state in which, when the monitoring IC is viewed from the front monitoring surface, the contour of the redundant IC does not protrude from the contour of the monitoring IC.

2. The voltage-detecting device according to claim 1, comprising:
    a lead frame on which the monitoring IC is placed from the rear monitoring surface, and that has plural leads around the perimeter thereof; wherein
    the surface area of the front monitoring surface is larger than the surface area of the rear redundant surface;
    the monitoring IC has plural electrode pads that are formed along one edge of the front monitoring surface in an area of the front monitoring surface that does not overlap the redundant IC when the monitoring IC is viewed from the front monitoring surface;
    the redundant IC has plural electrode pads that are formed on the front redundant surface along one edge of the front redundant surface;
    the rear redundant surface is mechanically connected to the front monitoring surface in a state in which the electrode pads of the redundant IC and the electrode pads of the monitoring IC face in the same direction; and
    one of the electrode pads of the redundant IC and one of the electrode pads of the monitoring IC are electrically connected using a bonding wire to a lead of plural leads that is used in common by the monitoring IC and the redundant IC.

3. The voltage-detecting device according to claim 1, wherein
    the number of detection blocks is plural;
    monitoring units are separately provided so as to correspond to each of the detection blocks;
    the sub voltage-detecting unit comprises:
    voltage-dividing resistors that are resistors for dividing the terminal voltage of the detection block;
    a reference-power source that is a power source for outputting a reference voltage for detecting a charged state of the detection block;
    a comparator that includes an inverting-input terminal and a non-inverting-input terminal, and to which voltage divided by the voltage-dividing resistors is inputted to one of the terminals, and the reference voltage is inputted to the other terminal;

a direct-current power source; and a resistor of which a first end side is connected to the direct-current power source;

the monitoring unit comprises:

a signal-output unit; and a communication switch that is closed or opened according to the logic of an output voltage of the output terminal of the comparator, and is a switch that electrically connects the signal-output unit and ground;

a second end side of the resistor is electrically connected to the signal-output unit of each monitoring unit; and the control unit has a signal-input unit that is electrically connected to the second-end side of the resistor.

4. The voltage-detecting device according to claim 3, comprising:

a voltage-generating unit that generates and outputs a diagnostic voltage;

a first switch that, when in a closed state, electrically connects the detection block and the voltage-dividing resistors, and when in an open state, electrically disconnects the detection block and the voltage-dividing resistors; and a second switch that, when in a closed state, electrically connects a divided-voltage input terminal that is a terminal of the non-inverting-input terminal and the inverting-input terminal of the comparator to which voltage divided by the voltage-dividing resistors is inputted and the voltage-generating unit, and when in an open state, electrically disconnects the divided-voltage input terminal and the voltage-generating unit; wherein the control unit performs a process for setting the first switch to the open state and the second switch to the closed state, and in this state operates the voltage-generating unit in order to change the diagnostic voltage so as to path through the reference voltage; and performs a process for determining that an abnormality has not occurred in the reference-power source when it is determined that the logic of an input signal of the signal-input unit is inverted when the diagnostic voltage is changed, and for determining that an abnormality has occurred in the reference power source when it is determined that the logic of the input signal of the signal-input unit is not inverted when the diagnostic voltage is changed.

5. The voltage-detecting device according to claim 4, wherein the voltage-generating unit is provided in the main voltage-detecting unit.

6. The voltage-detecting device according to claim 3, comprising:

a voltage-generating unit that generates and outputs a diagnostic voltage;

a first switch that, when in a closed state, electrically connects the detection block and the voltage-dividing resistors, and when in an open state, electrically disconnects the detection block and the voltage-dividing resistors; and a second switch that, when in a closed state, electrically connects a divided-voltage input terminal that is a terminal of the non-inverting-input terminal and the inverting-input terminal of the comparator to which voltage divided by the voltage-dividing resistors is inputted and the voltage-generating unit, and when in an open state, electrically disconnects the divided-voltage input terminal and the voltage-generating unit; wherein the control unit performs a process for setting the first switch to the open state and the second switch to the closed state, and in this state operates the voltage-generating unit in order to make the diagnostic voltage less than the reference voltage, or make the diagnostic voltage higher than the reference voltage; and performs a process for diagnosing whether or not there is an abnormality in a communication system from the comparator to the signal-input unit via the communication switch and the signal-output unit based on the logic of an input signal of the signal-input unit when the diagnostic voltage is made to be less than the reference voltage, or when the diagnostic voltage is made to be higher than the reference voltage.

7. A voltage-detecting device that is applied to a battery pack that includes a serially connected body of plural battery cells, comprising:

monitoring units for detecting a state of the battery pack; and a control unit that is separately provided from the monitoring units, and to which detection results of the monitoring units are inputted; wherein serially connected bodies of at least two of the battery cells of the battery cells of the battery pack form detection blocks;

each of the respective battery cells of a detection block, or a serially connected body of a number of battery cells in a detection block that is less than the number of the battery cells of the detection block is taken to be a battery for which voltage is to be detected; and the monitoring units comprise:

a main voltage-detecting unit for detecting terminal voltage of each of the batteries for which voltage is to be detected as the state of the battery pack;

a positive-electrode-side input unit that is electrically connected to a positive-electrode side of a detection block;

a negative-electrode-side input unit that is electrically connected to a negative-electrode side of a detection block; and sub voltage-detecting units for detecting terminal voltage of the detection blocks via the positive-electrode-side input units and the negative-electrode-side input units as the state of the battery pack, wherein the main voltage-detection unit comprises a monitoring IC that is an integrated circuit having a rectangular parallelepiped shape that is flat in the thickness direction;

at least part of the sub voltage-detecting unit comprises a redundant IC that is a separate from the monitoring IC and has a rectangular parallelepiped shape that is flat in the thickness direction; and the monitoring IC and the redundant IC are both arranged so as to be side by side in a plan view of the monitoring IC and the redundant IC.

* * * * *